(12) United States Patent
Cox et al.

(10) Patent No.: US 10,599,206 B2
(45) Date of Patent: Mar. 24, 2020

(54) TECHNIQUES TO CHANGE A MODE OF OPERATION FOR A MEMORY DEVICE

(71) Applicant: Intel Corporation, Santa Clara, CA (US)

(72) Inventors: Christopher E. Cox, Placerville, CA (US); Uksong Kang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 15/939,101

(22) Filed: Mar. 28, 2018

(65) Prior Publication Data
US 2018/0348838 A1    Dec. 6, 2018

Related U.S. Application Data

(60) Provisional application No. 62/514,307, filed on Jun. 2, 2017.

(51) Int. Cl.
| G06F 1/00 | (2006.01) |
| G06F 1/324 | (2019.01) |
| G06F 3/06 | (2006.01) |
| G06F 1/3234 | (2019.01) |
| G11C 7/10 | (2006.01) |
| G11C 11/4072 | (2006.01) |
| G06F 1/3296 | (2019.01) |
| G11C 11/4078 | (2006.01) |
| G11C 11/4076 | (2006.01) |

(52) U.S. Cl.
CPC ............ *G06F 1/324* (2013.01); *G06F 1/3275* (2013.01); *G06F 1/3296* (2013.01); *G06F 3/065* (2013.01); *G06F 3/0625* (2013.01); *G06F 3/0634* (2013.01); *G06F 3/0673* (2013.01); *G11C 7/1045* (2013.01); *G11C 11/4072* (2013.01); *G11C 11/4076* (2013.01); *G11C 11/4078* (2013.01)

(58) Field of Classification Search
None
See application file for complete search history.

(56) References Cited

U.S. PATENT DOCUMENTS

| 8,799,698 B2 * | 8/2014 | Singvall ................... H03K 3/02 713/300 |
| 2006/0187226 A1* | 8/2006 | Bruno .................... G06F 1/3203 345/534 |
| 2009/0049314 A1* | 2/2009 | Taha ...................... G06F 1/3203 713/300 |
| 2010/0095137 A1* | 4/2010 | Bieswanger .......... G06F 1/3203 713/300 |
| 2017/0031785 A1* | 2/2017 | Jose ..................... G06F 11/1471 |
| 2018/0260018 A1* | 9/2018 | Ehmann ................ G06F 1/3287 |

* cited by examiner

*Primary Examiner* — Nitin C Patel
(74) *Attorney, Agent, or Firm* — Compass IP Law PC

(57) ABSTRACT

Examples include techniques to change a mode of operation for a memory device. Examples include using information stored at a memory array of the memory device to program mode registers at the memory device to change the mode of operation to a first mode of operation that corresponds to a frequency set point associated with dynamic voltage and frequency scaling for a processor coupled with the memory device.

30 Claims, 12 Drawing Sheets

| OP[7] | OP[6] | OP[5] | OP[4] | OP[3] | OP[2] | OP[1] | OP[0] |
|---|---|---|---|---|---|---|---|
| RFU Field 410 | | | | FSP Store Status Field 420 | | FSP Store Field 430 | |

FSP Store Register 400

*FIG. 4*

Table 500

| Function | Register Type | Operand | Data | Notes |
|---|---|---|---|---|
| FSP Entry | W | OP[1:0] (Field 430) | $00_B$: Normal Operation (Default Reg.)<br>$01_B$: Store FSP 1<br>$10_B$: Store FSP 2<br>$11_B$: Store FSP 3 | |
| FSP Store Status | R | OP[3:2] (Field 420) | $00_B$: Complete<br>$01_B$: In Progress<br>$10_B$: Operation Failed<br>$11_B$: RFU | 1,2 |
| RFU | TBD | OP[7:4] (Field 410) | | |

NOTES:
1 – This bit will stay as "01 – In Progress" unil it has completed upon which time it will revert back to "00 – Complete"
2 – In the case of Three dimensional stacked (3DS) devices, this bit will stay as "01 – In Progress" until all 3DS Slices have completed upon which time it will revert back to "00 – Complete"

*FIG. 5*

FSP Configuratoin Register 700

| OP[7] | OP[6] | OP[5] | OP[4] | OP[3] | OP[2] | OP[1] | OP[0] |
|---|---|---|---|---|---|---|---|
| RFU Field 710 | | | | FSP Switch Status Field 720 | | FSP Entry Field 730 | |

*FIG. 7*

Table 800

| Function | Register Type | Operand | Data | Notes |
|---|---|---|---|---|
| FSP Entry | W | OP[1:0] (Field 730) | $00_B$: Normal Operation (Default Reg.)<br>$01_B$: Switch to FSP 1<br>$10_B$: Switch to FSP 2<br>$11_B$: Switch to FSP 3 | |
| FSP Switch Status | R | OP[3:2] (Field 720) | $00_B$: Complete<br>$01_B$: In Progress<br>$10_B$: Operation Failed<br>$11_B$: RFU | 1,2 |
| RFU | TBD | OP[7:4] (Field 710) | | |

NOTES:
1 – This bit will stay as "01 – In Progress" until it has completed upon which time it will revert back to "00 – Complete
2 – In the case of Three dimensional stacked (3DS) devices, this bit will stay as "01 – In Progress" until all 3DS Slices have completed upon which time it will revert back to "00 – Complete"

*FIG. 8*

TECHNIQUES TO CHANGE A MODE OF OPERATION FOR A MEMORY DEVICE

TECHNICAL FIELD

Examples described herein are generally related to memory and use of mode registers to change a mode of operation.

BACKGROUND

Dynamic voltage and frequency scaling (DVFS) is a type of technique that may be used by computing systems to save power. In some examples, DVFS techniques reduce power consumption by reducing a clock frequency of one or more processing elements of a computing system that allows for a corresponding reduction in a voltage supplied to the one or more processing elements. Typically, DVFS may be employed as a workload for the computing system changes. For example, less compute intensive workloads may enable the processing elements to operate at a lower frequency compared to higher or more compute intensive workloads. Memory systems coupled with these processing elements usually need to be reconfigured to account for frequency changes.

BRIEF DESCRIPTION OF THE DRAWINGS

FIG. 4 illustrates an example first register
FIG. 5 illustrates an example first table.
FIG. 7 illustrates an example second register.
FIG. 8 illustrates an example second table.

DETAILED DESCRIPTION

As contemplated in the present disclosure, memory systems coupled with processing elements of a computing system usually need to be reconfigured to account for frequency changes caused when implementing DVFS techniques. In some examples, a host for the computing system may need to reconfigure the memory devices via changes to mode registers to account for frequency changes. For example, volatile types of memory such as dynamic random access memory (DRAM) may be included in these memory devices. Each DRAM memory device or die may have registers that need to be reconfigured. Older types of DRAM devices typically separately included registers of approximately 8 bytes. Newer types of DRAM devices include the use of decision feedback equalization (DFE) that have expanded the size of these registers to around 256 bytes (e.g., representing 256 8-bit mode registers). Separately reconfiguring or programming these registers of 256 bytes for each change in frequency may take an unacceptable amount of time and unacceptably degrade computing system performance.

According to some examples, one solution to save time in reconfiguring or reprogramming registers is to add sets of registers for each frequency set point (FSP) associated with DVFS. However, in an example DRAM device or die having 8 gigabits of memory capacity, each 256-byte set of registers may use approximately 1.5 percent of the DRAM devices die size. For this example, adding three sets of registers for three separate FSPs to each DRAM device or die may use nearly 5 percent of a respective DRAM's die size. This consumption of die size may be a cost that outweighs saving time in reconfiguring or reprogramming registers and/or implementing DVFS. It is with respect to these challenges that the examples described herein are needed.

Figure 1:
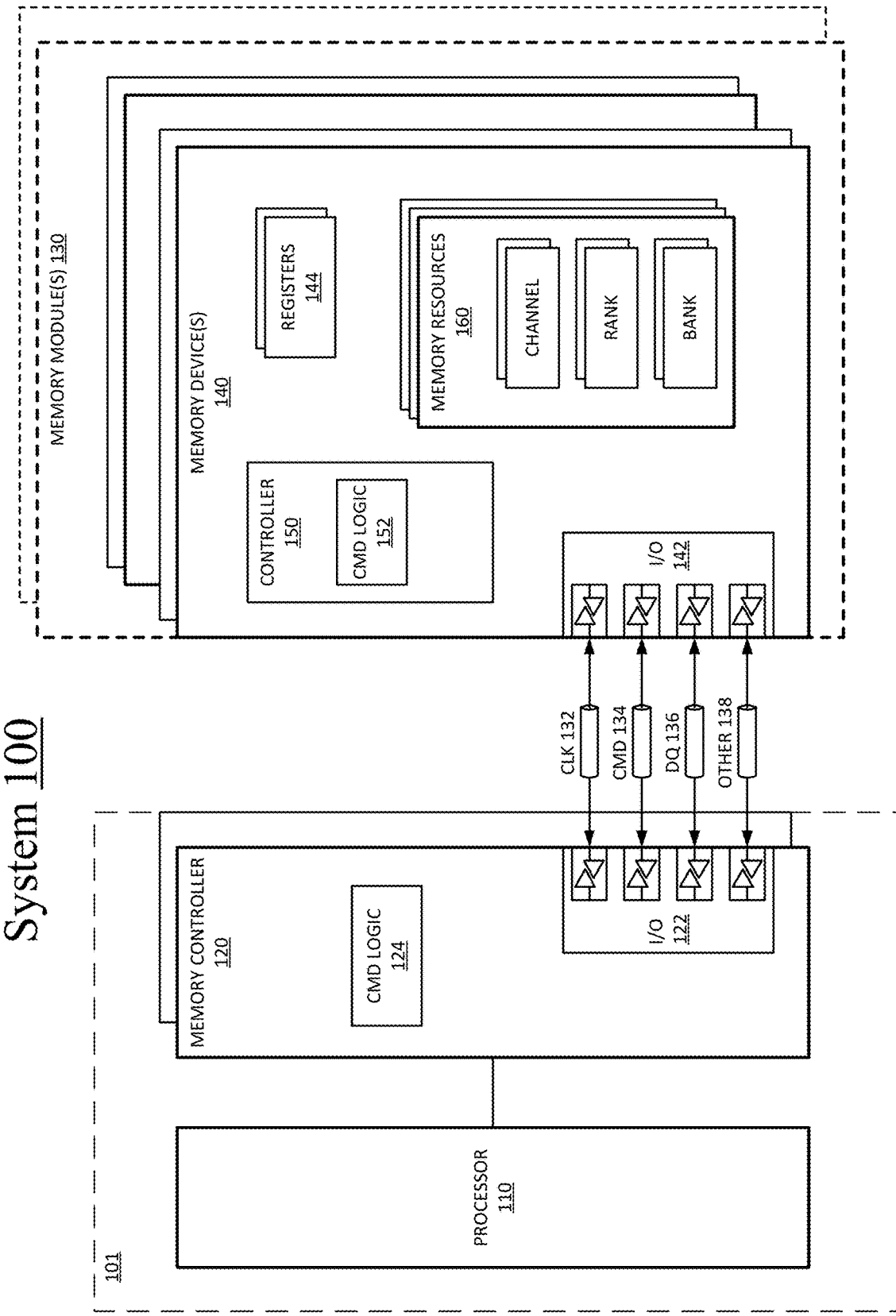
FIG. 1 illustrates an example system.

FIG. 1 illustrates an example system 100. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. System 100 can be implemented as an SOC (system on a chip), or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory device(s) 140. In some examples, in a process described more below, control logic of memory controller 120 may cause frequency set point (FSP) information to be written to wordlines at memory device(s) 140 to enable memory device(s) 140 to respond to frequency changes of processor 110 while implementing DVFS techniques (e.g., to save power).

Reference to memory devices can apply to different memory types. In some examples, memory device(s) 140 may include volatile types of memory. Volatile types of memory may be memory whose state (and therefore the data stored on it) is indeterminate if power is interrupted. Non-volatile types of memory may refer to memory whose state is determinate even if power is interrupted. Dynamic volatile memory requires refreshing the data stored in this type of memory to maintain state. One example of dynamic volatile memory includes DRAM, or some variant such as synchronous DRAM (SDRAM). A memory subsystem that may include memory device(s) 140 may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY, JESD235, originally published by JEDEC in October 2013), DDR5 (DDR version 5, currently in discussion by JEDEC), LPDDR5 (currently in discussion by JEDEC), HBM2 (HBM version 2, JESD235a, originally published by JEDEC in January 2016), HBM3 (HBM version 3, currently in discussion by JEDEC), or others or combinations of memory technologies, and technologies based on derivatives or extensions of such specifications.

In addition to, or alternatively to, volatile types of memory included in memory device(s) 140, non-volatile types of memory may be included in memory device(s) 140. According to some examples, non-volatile types of memory may include byte or block addressable types of non-volatile memory having a 3-dimensional (3-D) cross-point memory structure that includes chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above.

Descriptions herein referring to a "RAM" or "RAM device" may apply to any memory device that allows random access, whether including volatile or non-volatile types of memory. "DRAM" refers to dynamic RAM, and is volatile. The memory device or DRAM can refer to the die itself, to a packaged memory product that includes one or more dies, or both.

Memory device(s) 140 may be organized and managed as different channels, where each channel couples to buses and signal lines that couple to multiple memory devices in parallel. Each channel may be independently operable. Thus, each channel may be independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In some examples, settings for each channel are controlled by separate mode registers or other register settings. In some examples, each memory controller 120 manages a separate memory channel, although system 100 may be configured to have multiple channels managed by a single memory controller, or may have multiple memory controllers on a single channel. In some examples, memory controller 120 may be part of processor 110, such as logic implemented on the same die or implemented in the same package space as processor 110 (as shown by box 101).

According to some examples, as shown in FIG. 1, memory controller 120 includes input/output (I/O) interface logic 122 to couple to a system bus or a memory bus or both, such as a memory channel as referred to above. I/O interface logic 122 (as well as I/O interface logic 142 of memory device(s) 140) may include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. Although FIG. 1 illustrates I/O interface logic 122 and 142 as including bidirectional connections, some embodiments include unidirectional connections. While shown as coupling I/O 122 from memory controller 120 to I/O 142 of memory device(s) 140, it will be understood that in an implementation of system 100 where groups of memory device(s) 140 are accessed in parallel, multiple memory devices can separately include I/O interfaces to the same interface of memory controller 120. In an implementation of system 100 including one or more memory modules 130, I/O 142 can include interface hardware of the memory module in addition to interface hardware on the memory device itself. Other memory controllers 120 may include separate interfaces to other memory devices 140.

In some examples, a system bus may be implemented as multiple signal lines coupling memory controller 120 to memory device(s) 140. The system bus may include at least clock (CLK) 132, command/address (CMD) 134, read DQ 136, and zero or more other signal lines 138. In one example, a bus or connection between memory controller 120 and memory device(s) 140 may be referred to as a memory bus. The signal lines for CMD 134 may be referred to as a "C/A bus" (or ADD/CMD bus, or some other designation indicating the transfer of commands and address information) and the signal lines for write and read DQ 136 may be referred to as a "data bus." Independent channels may have different clock signals, C/A buses, data buses, and other signal lines. Thus, in some examples, system 100 may have multiple "system buses," in the sense that an independent interface path may be considered a separate system bus. It will be understood that in addition to the lines explicitly shown in FIG. 1, a system bus may include strobe signaling lines, alert lines, auxiliary lines, and other signal lines.

It will be understood that the system bus includes a command bus 134 configured to operate at a bandwidth. In one example, the CMD 134 and write DQ 136 signal lines may include unidirectional lines for write and command data from the host to memory, and read DQ 136 may include unidirectional lines for read data from the memory to the host. According to some examples, the data bus may include bidirectional lines for read data and for write/command data. Based on design of system 100, or implementation if a design supports multiple implementations, the data bus can have more or less bandwidth per memory device(s) 140. For example, the data bus can support memory devices that have either a x32 interface, a x16 interface, a x8 interface, or other interface. The convention "xW," where W is a binary integer refers to an interface size of memory device(s) 140, which represents a number of signal lines to exchange data with memory controller 120. The interface size of memory device(s) 140 is a controlling factor on how many memory devices of memory device(s) 140 than can be used concurrently per channel in system 100 or coupled in parallel to the same signal lines.

Memory device(s) 140 may represent memory resources for system 100. According to some examples, each memory device included in memory device(s) 140 may be a separate memory die. In some examples, each memory device of memory device(s) 140 may interface with multiple (e.g., 2) channels per device or die. Also, each memory device may include I/O interface logic 142, which has a bandwidth determined by the implementation of the memory device (e.g., x16 or x8 or some other interface bandwidth). I/O interface logic 142 may enable memory device(s) 140 to interface with memory controller 120. I/O interface logic 142 can include a hardware interface, and can be in accordance with I/O interface logic 122 of memory controller 120, but at the memory device end. According to some examples, multiple memory devices of memory device(s) 140 may be connected in parallel to the same data buses. For example, system 100 may be configured with multiple memory devices of memory device(s) 140 coupled in parallel, with each memory device responding to a command, and accessing memory resources 160 internal to each. For a Write operation, an individual memory device of memory device(s) 140 may write a portion of the overall data word, and for a Read operation, an individual memory device of memory device(s) 140 may fetch a portion of the overall data word. As non-limiting examples, a specific memory device may provide or receive, respectively, 8 bits of a 128-bit data word for a Read or Write transaction, or 8 bits or 16 bits (depending for a x8 or a x16 device) of a 256-bit data word. The remaining bits of the word may be provided or received by other memory devices in parallel.

In some examples, memory device(s) 140 may be disposed directly on a motherboard or host system platform (e.g., a PCB (printed circuit board) on which processor 110 is disposed) of a computing device. According to some examples, memory device(s) 140 may be organized into memory module(s) 130. In some examples, memory module(s) 130 may represent one or more dual inline memory modules (DIMMs). In some examples, memory module(s) 130 may represent another organization of multiple memory devices to share at least a portion of access or control circuitry, which can be a separate circuit, a separate device, or a separate board from the host system platform. Memory module(s) 130 may include multiple memory device(s) 140, and memory modules of memory module(s) 130 may include support for multiple separate channels to the included memory devices respectively disposed on them.

Memory device(s) 140 may separately include memory resources 160. In some examples, memory resources 160 may represent individual arrays of memory locations or storage locations for data. Memory resources 160 may be managed as rows of data, accessed via wordline (row) and bitline (individual bits within a row) control. Memory resources 160 may be organized as separate channels, ranks, and banks of memory. Channels may be independent control paths to storage locations within memory device(s) 140. Ranks may refer to common locations across multiple memory devices (e.g., same row addresses within different devices). Banks may refer to arrays of memory locations within a memory device from among memory device(s) 140. In some examples, banks of memory may be divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations may be accessed over a specific channel as a specific bank, which can also belong to a rank. Thus, the organization of memory resources will be understood in an inclusive, rather than exclusive, manner.

According to some examples, memory device(s) 140 may separately include registers 144. Registers 144 may represent one or more storage devices or storage locations that provide configuration or settings for the operation of each memory device from among memory device(s) 140. In some examples, registers 144 may provide a storage location for memory device(s) 140 to store data for access by memory controller 120 as part of a control or management operation.

In some examples, registers 144 may include mode registers. In some examples, registers 144 may include one or more multipurpose registers. The configuration of locations within registers 144 may configure memory device 140 to operate in a different "mode," where command information can either explicitly or implicitly trigger different operations within memory device(s) 140 based on the mode. Additionally or in the alternative, different modes can also trigger different operation from address information or other signal lines depending on the mode. Settings of registers 144 can indicate configuration for I/O settings, timing (e.g., responsive to an FSP for processor 110 when implementing DVFS techniques), termination or ODT (on-die termination), driver configuration, or other I/O settings.

In some examples, as shown in FIG. 1, memory device(s) 140 may include a controller 150. Controller 150 may represent control logic within the memory device to control internal operations within the memory device. For example, controller 150 may decode commands sent by memory controller 120 and may generate or initiate internal operations to execute or satisfy the commands. Controller 150 may be referred to as an internal controller. Controller 150 may determine what mode is selected based on registers 144, and configure the internal execution of operations for access to memory resources 160 or other operations based on the selected mode. Controller 150 may generate control signals to control the routing of bits within memory device(s) 140 to provide a proper interface for the selected mode and direct a command to the proper memory locations or addresses.

According to some examples, as shown in FIG. 1, memory controller 120 may include command (CMD) logic 124. CMD logic 124 may represents logic or circuitry to generate commands to send to memory device(s) 140. Typically, signaling in memory subsystems may include address information within or accompanying a sent command to indicate or select one or more memory locations where the memory devices should execute the command. In some examples, controller 150 of memory device(s) 140 may include command (CMD) logic 152 to receive and decode command and address information received via I/O 142 from memory controller 120. For these examples, based on the received command and address information, controller 150 may control timing of operations of the logic and circuitry within memory device(s) 140 to execute the commands. Controller 150 may be responsible for compliance with standards or specifications within memory device(s) 140, such as timing and signaling requirements. Memory controller 120 can also ensure compliance with standards or specifications by access scheduling and control.

Figure 2:
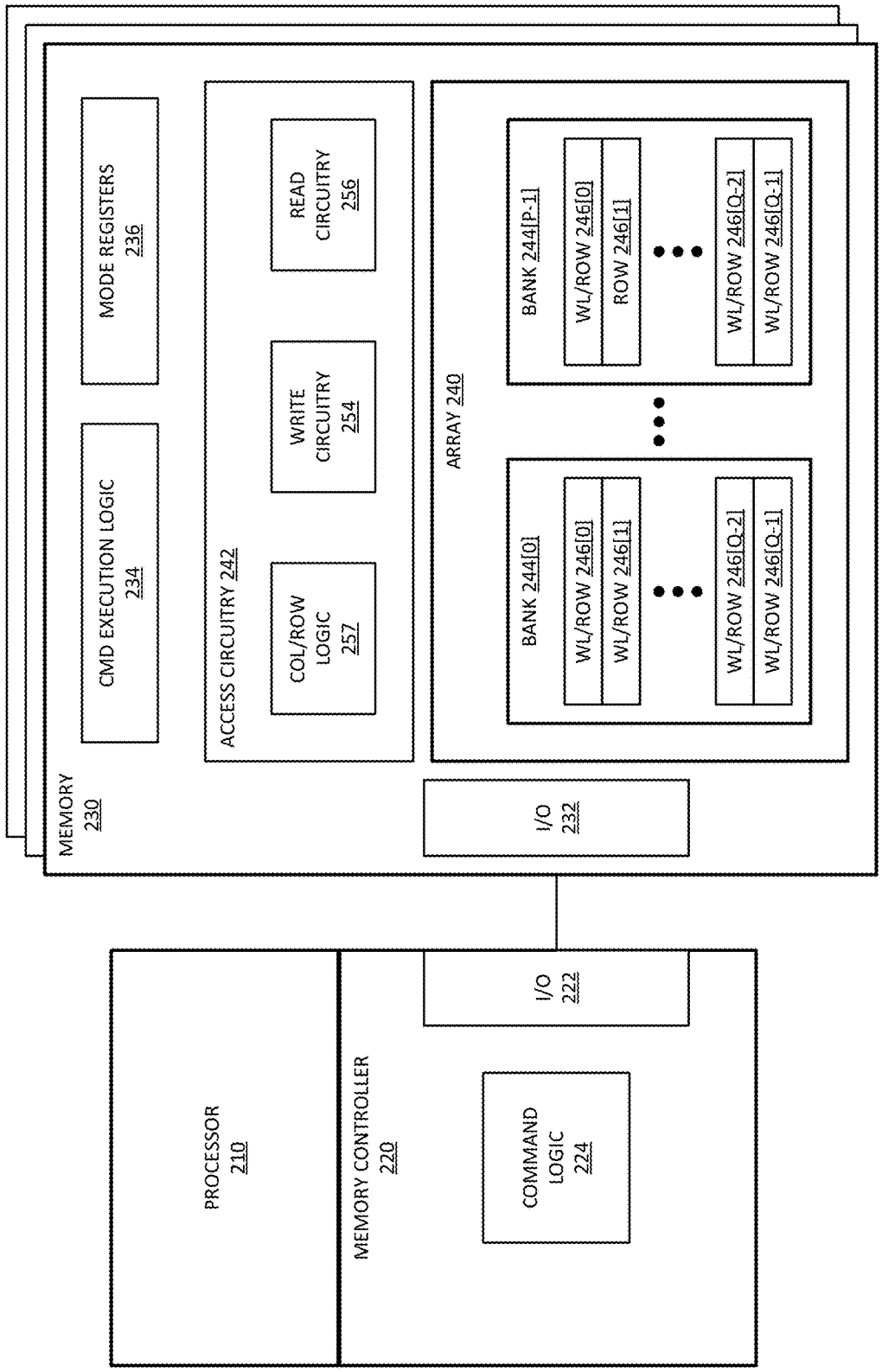
FIG. 2 illustrates an example second system.

FIG. 2 illustrates an example system 200. System 200 illustrates one example of a system in accordance with system 100 of FIG. 1. As shown in FIG. 2, system 200 includes a processor 210, which may include one or multiple processors whose execution generates requests for data or code or both stored in memory 230. Memory 230 may represent memory resources, such as the memory resources described above with respect to FIG. 1. According to some examples, memory controller 220 may generate memory access commands for specific addresses or storage location of memory 230 in response to memory requests created by execution of processor 210. Memory controller 220 may maintain or have access to mapping information to map data address information in processor 210 with physical locations in memory 230. In some examples, memory controller 220 may be an integrated memory controller (e.g., iMC) of processor 210. In other examples, memory controller 220 may be a standalone controller device or standalone circuit.

In other examples, processor 210 and memory controller 220 may be part of a common SOC.

According to some examples, as shown in FIG. 2, memory controller 220 includes I/O 222. I/O 222 may represent interface hardware and logic, such as what is described above with respect to I/O 122 of system 100. Memory 230 may include I/O 232. I/O 232 may couple with I/O 222 via corresponding signal lines to enable memory 230 to exchange data and commands with memory controller 220. Command logic 224 of memory controller 220 may represent logic to enable memory controller 220 to issue commands to memory 230. The commands may include commands to set one or more modes of memory 230. The commands may also include commands to cause FSP information to be stored to one or more memory locations (e.g., one or more wordlines) of memory 230. The commands may also cause memory 230 to retrieve the stored FSP information to change the one or more modes responsive to processor 210 implementing DVFS techniques.

In some examples, memory 230 may include multiple separate memory devices, and I/O 222 may interface the multiple devices in parallel. Also, in some examples, as shown in FIG. 2, memory 230 may include an array 240, which may represent hardware storage locations.

According to some examples, as shown in FIG. 2, memory 230 may include command (CMD) execution logic 234. CMD execution logic 234 may represent logic that enables memory 230 to decode commands. For example, CMD execution logic 234 may include logic to decode register store or register configuration commands sent from memory controller 220. Based on decoding the command, CMD execution logic 234 may generate one or more internal commands to perform the operations required by the commands. The internal commands can include setting logic values of switches, gates, or other hardware resources, or a combination, to perform the desired operations. Memory 230 includes access circuitry 242, which represents circuitry for accessing the memory array 240. In some examples, access circuitry 242 includes column and row logic 257 to select specific columns and rows of array 240. Column and row logic 257 can include circuitry such as decoders, buffers, counters, and drivers to enable the selection of specific bits of specific wordlines (WL)/rows 246 of one or more banks 244 of the memory array 240. Column logic can issue column address strobes (CAS) and row logic can issue row address strobes (RAS) in response to address decoding of address information in a received command. In some examples, column and row logic includes multiplexers, logic gates, or other circuitry, or a combination of circuits, to decode the address information.

In some examples, as shown in FIG. 2, access circuitry 242 of memory 230 may also include write circuitry 254 and read circuitry 256. For these examples, write circuitry 254 may include circuitry to enable writing data to the memory cells of the array 240. Read circuitry 256 may include circuitry to enable reading the data stored in the memory cells of the memory array 240. Write circuitry 254 may include, for example, write drivers to interface with sense amplifiers of array 240 to drive data into memory cells included in array 240. Read circuitry 256 may include one or more read drivers to interface with the sense amplifiers of array 240 to read the stored data. In some examples, access circuitry 242 may include a read and write driver for each bank. Although access circuitry 242 is illustrated as being external to array 240, in some examples, array 240 includes access circuitry 242. For example, access circuitry 242 is included in each bank 244.

According to some examples, memory 230 includes mode registers 236 or equivalent to store configuration information that at least partially controls the operation of memory 230. For these examples, settings within mode registers 236 may control the mode or state of operation of memory 230, and can control how received commands are decoded for execution by memory 230. Similar to registers 144 described above for FIG. 1, mode registers 236 may include one or more bits to control the mode or state of operation of memory 230.

In one example, write circuitry 254 includes circuitry to enable performance of one or more FSP STORE commands to write FSP information to a wordline or row of a bank included in array 240. For these examples, write circuitry 254 writes FSP information to the wordline or row of the bank depending on a mode register setting of a mode register included in mode registers 236. For example, write circuitry 254 may write FSP information based on a value stored in the mode register. FSP information may include information associated with configuring all mode registers included in mode registers 236 to enable memory 230 to quickly adapt to specific FSPs while processor 210 implements DVFS techniques. A In some examples, read circuitry 256 may include circuitry to enable performance of one or more FSP CONFIG commands to read FSP information for specific FSPs and provide the FSP information to CMD execution logic 234 to configure mode registers 236 to cause memory 230 to operate in respective modes that corresponds with specific FSPs. Thus, based on a single command from memory controller 220, CMD execution logic 234 may quickly read FSP information from a bank of array 240 and internally reconfigure mode registers 236 based on the FSP information. The internal reconfiguration of mode registers 236 may be substantially faster than memory controller 220 sending commands to individually reconfigure mode registers 236. The relative speeds of internal vs. external becomes greater as the number of mode registers included in 236 increases.

Figure 3:
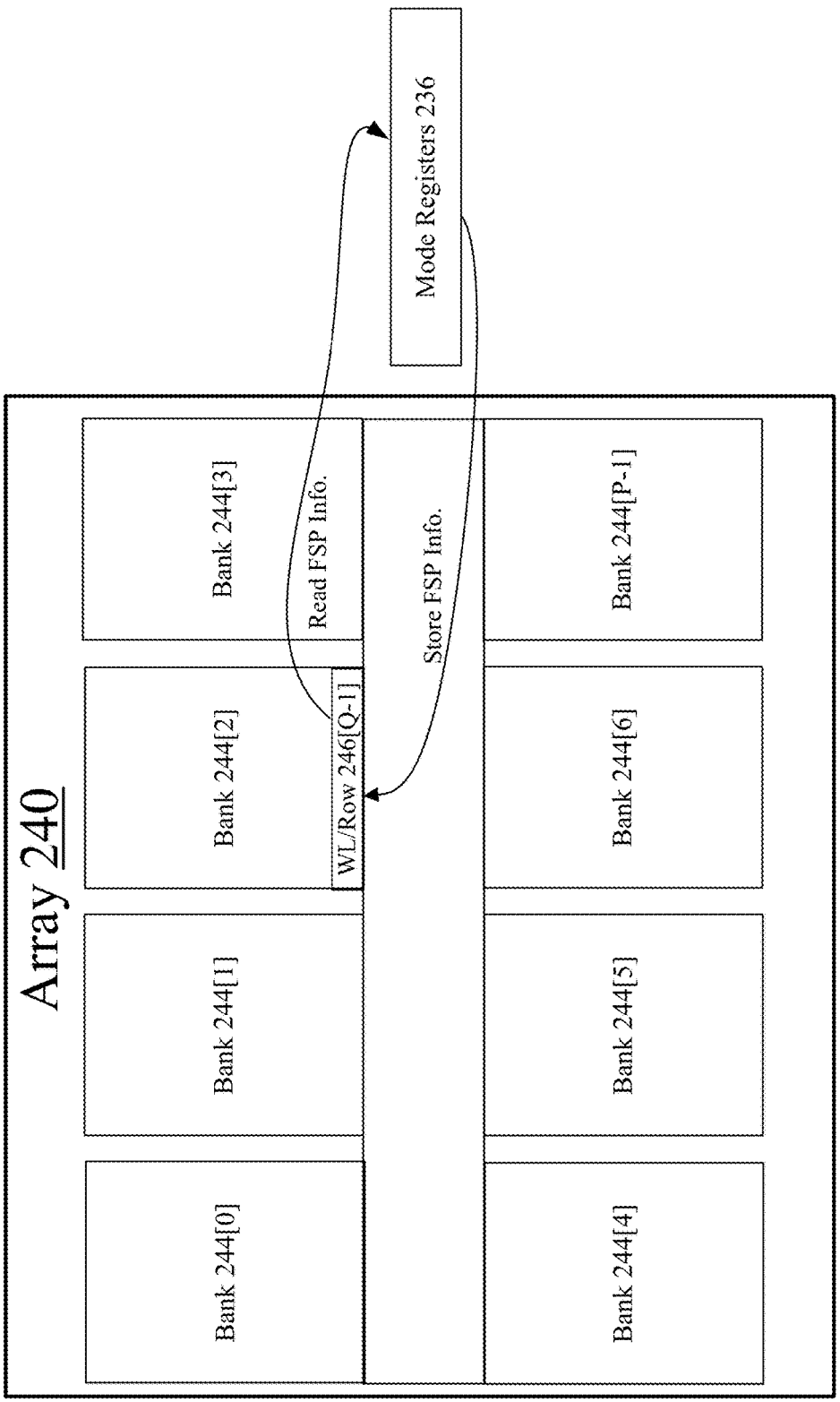
FIG. 3 illustrates an example array.

FIG. 3 illustrates an example of system 300. In some examples, as shown in FIG. 3, system 300 includes array 240 and mode registers 236. FIG. 3 shows an expanded view of array 240 shown in FIG. 2 and described above. Mode registers 236 are also shown as part of system 300 in order to describe a simplified illustration of how configuration may be copied from mode registers and stored to a wordline (WL)/row of a bank of array 240 and then read from that WL/row responsive to received commands (e.g., received from memory controller 120).

According to some examples, mode registers 236 may include 256 8-bit mode registers that may store configuration data of up to 256 bytes. For these examples, each WL/row of banks 244 may have a 2 kilobyte (KB) capacity. Hence, up to 8 copies or versions of configuration data maintained in mode registers 236 may be stored to a WL/row of banks 244. In some examples, respective configuration data may be associated with respective modes of operation. Each respective mode of operation may correspond to one of multiple frequency set points (FSPs) during which a processor (e.g., processor 210) implements DVFS. Configuration data associated with a mode of operation that corresponds to one of multiple FSPs may be referred to as FSP information. For example, a first FSP may have first FSP information, a second FSP may have second FSP information, a third FSP may have third FSP information, etc.

According to some examples, the WL/rows of banks 244 used to store FSP information may be spare WL/rows provided by a manufacture of the array 240 that may be used only internally by logic of a memory device or array. Alternatively, the WL/rows of banks 244 used to store FSP information may be excluded for addressing from a memory map provide external to the memory device or array for use to store the FSP information. The exclusion from addressing requires more coordination between logic of the memory device or array and a memory controller compared to use of spare WL/rows.

In some examples, each version of FSP information may be stored as multiple copies in a single WL/row such as 8 copies for a WL/row of banks 244 having a 2 KB capacity or only duplicate copies of each version of FSP information may be stored to the single WL/row having the 2 KB capacity. For these examples, the duplicate copies may utilize simple XOR logic to check for weak bit failures in memory cells of array 240. In the advent of weak or bad bit failures, a flag may be asserted in mode registers 236 to indicate a failure to configure mode registers 236 from FSP information stored to the WL/row.

FIG. 4 illustrates an example FSP store register 400. According to some examples, FSP store register 400 may be an example format for an 8-bit mode register included in mode registers to configure an array such as array 240 for operation such as mode registers 236 shown in FIGS. 2 and 3. In some examples, as shown in FIG. 4, the example format of FSP store register 400 includes a reserved for future use (RFU) field 410, an FSP store status field 420 and an FSP store field 430. As described more below, FSP store field 430 may be associated with an FSP STORE command to cause the array to store FSP information to a WL/row of a bank included in the array. FSP store status field 420 may be utilized to provide a status of the storing of the FSP information.

In some examples, logic at a memory or memory device that includes array 240 (e.g., CMD logic 234) may receive one or more commands (e.g., from memory controller 220) to cause the configuration or programing of mode registers 236 to operate array 240 in a first mode for a first FSP. The logic may then configure or program mode registers 236 for that first FSP. An FSP STORE command may then be received by the logic to cause first FSP information to be stored to WL/row 246(Q-1) of bank 244. Subsequent commands may cause the configuration or programming of mode registers 236 to operate array 240 in respective modes for second, third, etc. FSPs. Also, subsequent STORE FSP commands may be received to cause the second, third, etc. FSP information to be stored to WL/row 246(Q-1). Alternatively, a single STORE FSP command may be received that may indicate multiple FSP configurations are expected and to direct the logic to store FSP information for a succession of FSPs until the succession is complete.

FIG. 5 illustrates an example table 500. In some examples, table 500 includes a description of functions, register type, operand, data and notes related to fields 410, 420 and 430 of the example format for FSP store register 400. For these examples, the function of "FSP Entry" may be a write (W) register type to write to bits 1 and 0 for operand OP[0:1]. As shown in table 500, four binary values may be written to OP[0:1] to indicate "Normal Operation", "Store FSP 1", "Store FSP 2" or "Store FSP 3". Examples are not limited to 2-bit values to indicate an FSP Entry. In some examples, additional bits may be added to this operand to enable the storing of additional FSPs.

According to some examples, logic at a memory device may receive an FSP STORE command from a memory controller that causes a value to be written to OP[0:1] to indicate what FSP is to be stored to a WL/row of a bank included in an array of the memory device. Also for these examples, the function of "FSP Store Status" may be a read (R) register type that may be read by the memory controller to determine a status of an FSP store to the WL/row. In some examples, the logic at the memory may assert bits 2 and 3 for operand OP[3:2] to indicate the status of the FSP store to indicate "Complete", "In Progress" or "Operation Failed". A fourth value for OP[3:2] may be reserved for future use. Also, the remaining bits of FSP store register 400 for OP[7:4] may also be reserved for future use.

Figure 6:
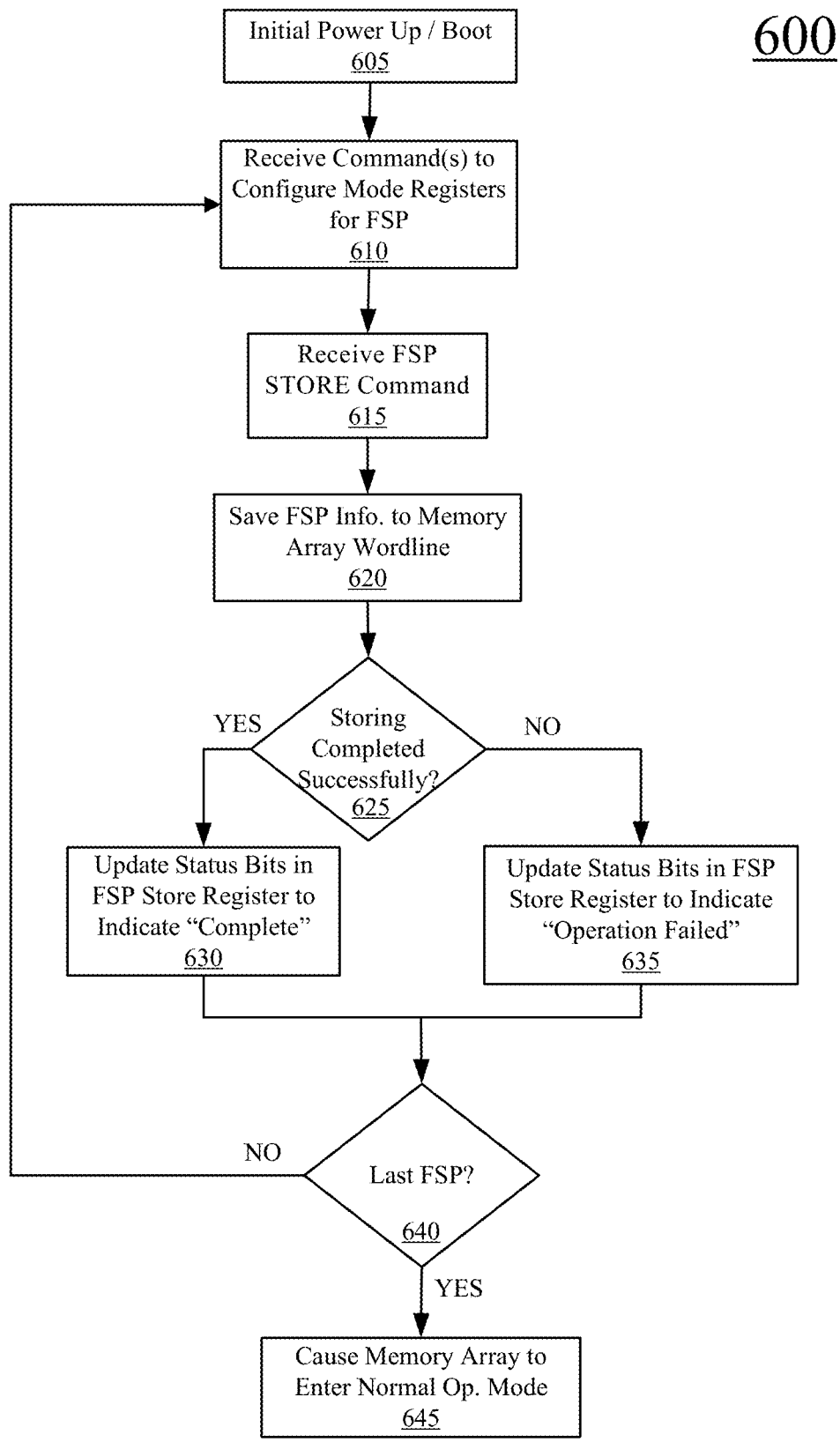
FIG. 6 illustrates an example first logic flow.

FIG. 6 illustrates an example logic flow 600. In some examples, logic flow 600 may depict a logic flow for causing FSP information to be stored to a WL/row of a bank for a memory array of a memory device. For these examples, elements of systems 200 and 300 shown in FIG. 2 or 3 and described above may be used to describe processes or actions associated with at least portions of logic flow 600. For example, command logic 224 of memory controller 220, memory 230, CMD execution logic 234, mode registers 236 or array 240. Also, the example register format for FSP store register 400 and table 500 for describing example fields or bits of FSP store register 400 as shown in FIGS. 4 and 5 may also be associated with at least portions of logic flow 600. Although examples are not limited to elements of systems 200 and 300 or to the use of the example fields or bits of FSP store register 400 and table 500.

Beginning at block 605, memory 230 may be initially powered up or booted up. In some examples, the initial power up/boot of memory 230 may cause memory controller 220 to initiate programming of mode registers 236 to configure array 240 for operation at one or more FSPs.

Moving to block 610, one or more configuration commands may be received from command logic 224 at memory controller 220 to direct CMD execution logic 234 to program mode registers 236 to configure array 240 for a mode of operation corresponding to an FSP.

Moving to block 615, an FSP STORE command may be received from command logic 224. In some examples, the FSP STORE command may be sent after all relevant mode registers of mode registers 236 have been programmed to configure array 240 for the mode of operation corresponding to the FSP. The FSP STORE command may cause CMD execution logic 234 to selectively assert bits 0 and 1 of OP[1:0] of a mode register in the example format of FSP store register 400 to indicate what FSP is to be saved (e.g., first FSP).

Moving to block 620, FSP information for the indicated FSP may be copied from mode registers 236 and saved to WL/row 246(Q-1) of bank 244. In some examples, CMD execution logic 234 may update OP[3:2] of the mode register in the example format of FSP store register 400 to indicate an "In Progress" state.

Moving to decision block 625, a determination is made as to whether the storing of the FSP information has been completed successfully. If completed successfully, the logic flow moves to block 630. Otherwise, the logic flow moves to block 635.

Moving from decision block 625 to block 630, CMD execution logic 234 may update OP[3:2] of the mode register in the example format of FSP store register 400 to indicate that storing of the FSP information is complete for the FSP indicated in the received FSP STORE command.

Moving from decision block 625 to block 635, CMD execution logic 234 may update OP[3:2] of the mode register in the example format of FSP store register 400 to indicate that the operation has failed for storing the FSP information for the FSP indicated in the received FSP STORE command.

Moving from either block 630 or 635 to decision block 640, a determination may be made by CMD execution logic 234 as to whether the FSP information stored was for a last FSP. In some examples, the determination may be made based on information in the FSP STORE command indicating how many FSP configurations are to be expected. For example, if the FSP information was for a first of three expected FSPs, then two more FSP configurations are expected and FSP information may be stored for each of these two additional FSP configurations. If CMD execution logic 234 determines the FSP information stored was for a last FSP, the logic flow moves to block 645. Otherwise, the logic flow returns to block 610 to await additional commands to configure mode registers 236 for one or more other FSPs.

Moving from decision block 640 to block 645, CMD execution logic 234 may cause array 240 to enter a normal mode of operation. In some examples, the normal mode of operation may correspond to when a processor is in a normal mode of operation and has not yet changed its operating frequency to save power via DVFS techniques. CMD execution logic 234 may update OP[1:0] of the mode register in the example format of FSP store register 400 to indicate "Normal Operation". The logic flow 600 is then done.

FIG. 7 illustrates an example FSP configuration register 700. According to some examples, FSP configuration register 700 may be an example format for an 8-bit mode register included in mode registers to configure an array such as array 240 for operation such as mode registers 236 shown in FIGS. 2 and 3. In some examples, as shown in FIG. 7, the example format of FSP configuration register 700 includes a reserved for future use (RFU) field 710, an FSP switch status field 720 and an FSP entry field 730. As described more below, FSP entry field 730 may be associated with an FSP CONFIG command to cause FSP information to be read from a WL/row of a bank included in the array for use to program mode registers of an array of a memory device to operate in a mode corresponding to a given FSP. FSP switch status field 720 may be utilized to provide a status of the reading of the FSP information.

FIG. 8 illustrates an example table 800. In some examples, table 800 includes a description of functions, register type, operand, data and notes related to fields 710, 720 and 730 of the example format for FSP configuration register 700. For these examples, the function of "FSP Entry" may be a W register type to write to bits 1 and 0 for operand OP[0:1]. As shown in table 800, four binary values may be written to OP[0:1] to indicate "Normal Operation", "Switch to FSP 1", "Switch to FSP 2" or "Switch to FSP 3". Examples are not limited to 2-bit values to indicate an FSP Entry. In some examples, additional bits may be added to this operand to enable the switching to more than three FSPs.

According to some examples, logic at a memory device may receive an FSP CONFIG command from a memory controller that causes a value to be written to OP[0:1] to indicate which of three FSPs that the memory device is to switch from one mode of operation (e.g., normal mode) to another mode that corresponds to the indicated FSP. For these examples, FSP information for the indicated FSP may be stored to a WL/row of a bank included in an array of the memory device as mentioned above for FIGS. 3-6. Also for these examples, the function of "FSP Switch Status" may be an R register type that may be read by the memory controller to determine a status of an FSP switch. In some examples, the logic at the memory may assert bits 2 and 3 for operand OP[3:2] to indicate the status of the FSP switch to indicate "Complete", "In Progress" or "Operation Failed". A fourth value for OP[3:2] may be reserved for future use. Also, the remaining bits of FSP store register 400 for OP[7:4] may also be reserved for future use.

Figure 9:
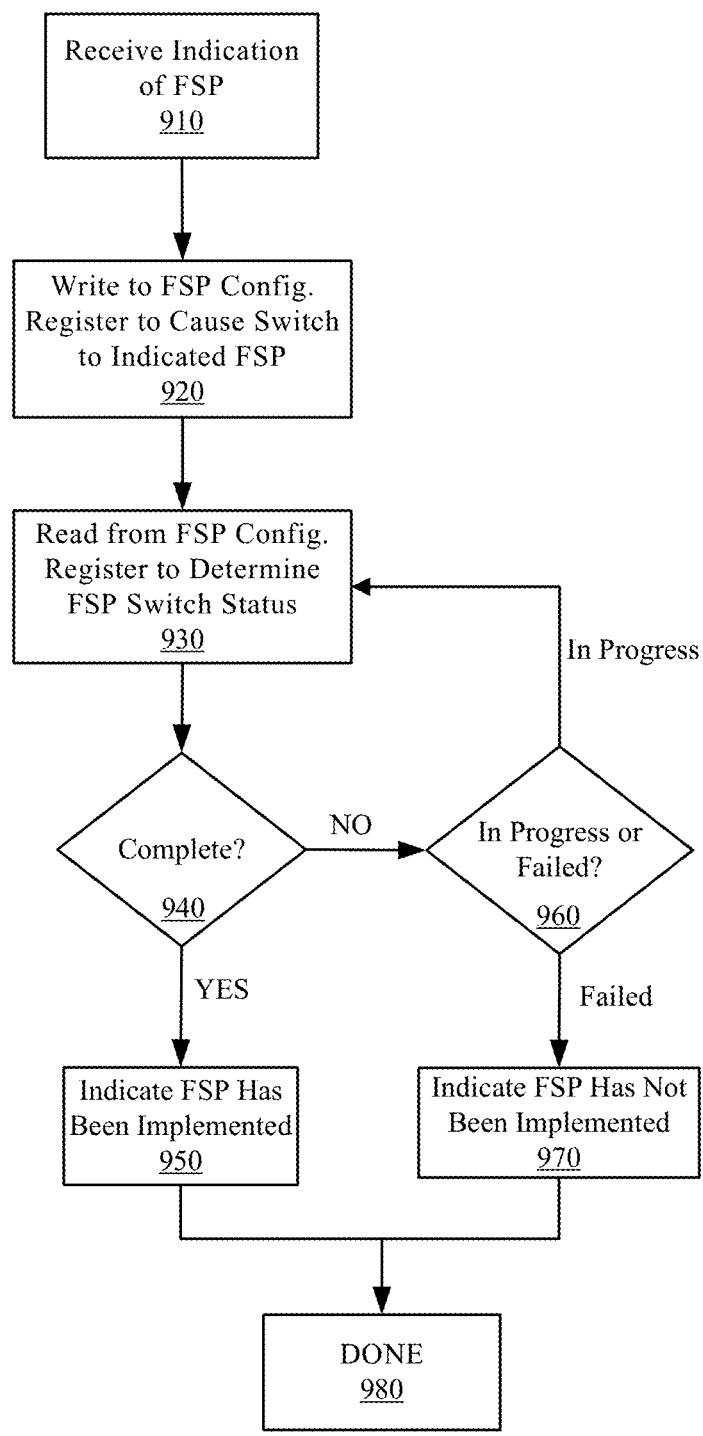
FIG. 9 illustrates an example second logic flow.

FIG. 9 illustrates an example logic flow 900. In some examples, logic flow 900 may depict a logic flow for causing a memory device to switch to a mode of operation that corresponds to an FSP using FSP information be stored to a WL/row of a bank for a memory array of the memory device. For these examples, elements of systems 200 and 300 shown in FIG. 2 or 3 and described above may be used to describe processes or actions associated with at least portions of logic flow 900. For example, processor 210, command logic 224 of memory controller 220, memory 230, CMD execution logic 234, mode registers 236 or array 240. Also, the example register format for FSP configuration register 700 and table 800 for describing example fields of FSP configuration register 700 as shown in FIGS. 7 and 8 may be associated with at least portions of logic flow 900. Although examples are not limited to elements of systems 200 and 300 or to the use of the example fields or bits of FSP configuration register 700 and table 800.

Beginning at block 910, processor 210 may send an indication that an FSP is being implemented. In some examples, the FSP may be a first FSP of multiple FSPs associated with DVFS techniques implemented by processor 210 to save power.

Moving to block 920, a mode register of mode registers 236 may be programmed or written to cause memory 230 to switch to a mode of operation that corresponds to the first FSP. In some examples, the mode register may be in the example format of FSP configuration register 700 and command logic 224 may send an FSP CONFIG command to cause the mode register to be programmed or written. The FSP CONFIG command may cause CMD execution logic 234 to selectively asserts bits 0 and 1 of OP[1:0] of a mode register in the example format of FSP configuration register 700 to indicate the mode is to correspond to the first FSP. CMD execution logic 234 may then cause FSP information to be read from a WL/row of array 240 and then cause the FSP information to be used to program mode registers 236 for the mode of operation corresponding to the first FSP.

Moving to block 930, command logic 224 may send commands to CMD execution logic 234 to read from the mode register in the example format of FSP configuration register 700 to determine the FSP switch status. In some examples, CMD execution logic 234 may read OP[3:2] or field 720 to determine the status.

Moving to decision block 940, if the status indicated by reading the mode register indicates the FSP switch is complete, the logic flow moves to block 950. Otherwise, the logic flow moves to decision block 960.

Moving from decision block 940 to block 950, command logic 224 or memory controller 220 may indicate to processor 210 that the FSP switch has been implemented.

Moving from decision block 940 to decision block 960, a determination may be made by command logic 224 of whether a status of the FSP switch is indicated as still in progress or has failed at memory 230. If the FSP switch is still in progress, the logic flow moves back to block 930. Otherwise the logic flow moves to block 970.

Moving from decision block 960 to block 970, command logic 224 or memory controller may indicate to processor 210 that that the FSP switch has not be implemented. In some examples, processor 210 may abort a frequency change and return to a normal operating mode based on the indication that the FSP switch was not implemented at the memory 230.

Moving from block 950 or block 970 the logic flow is done at block 980.

Figure 10:
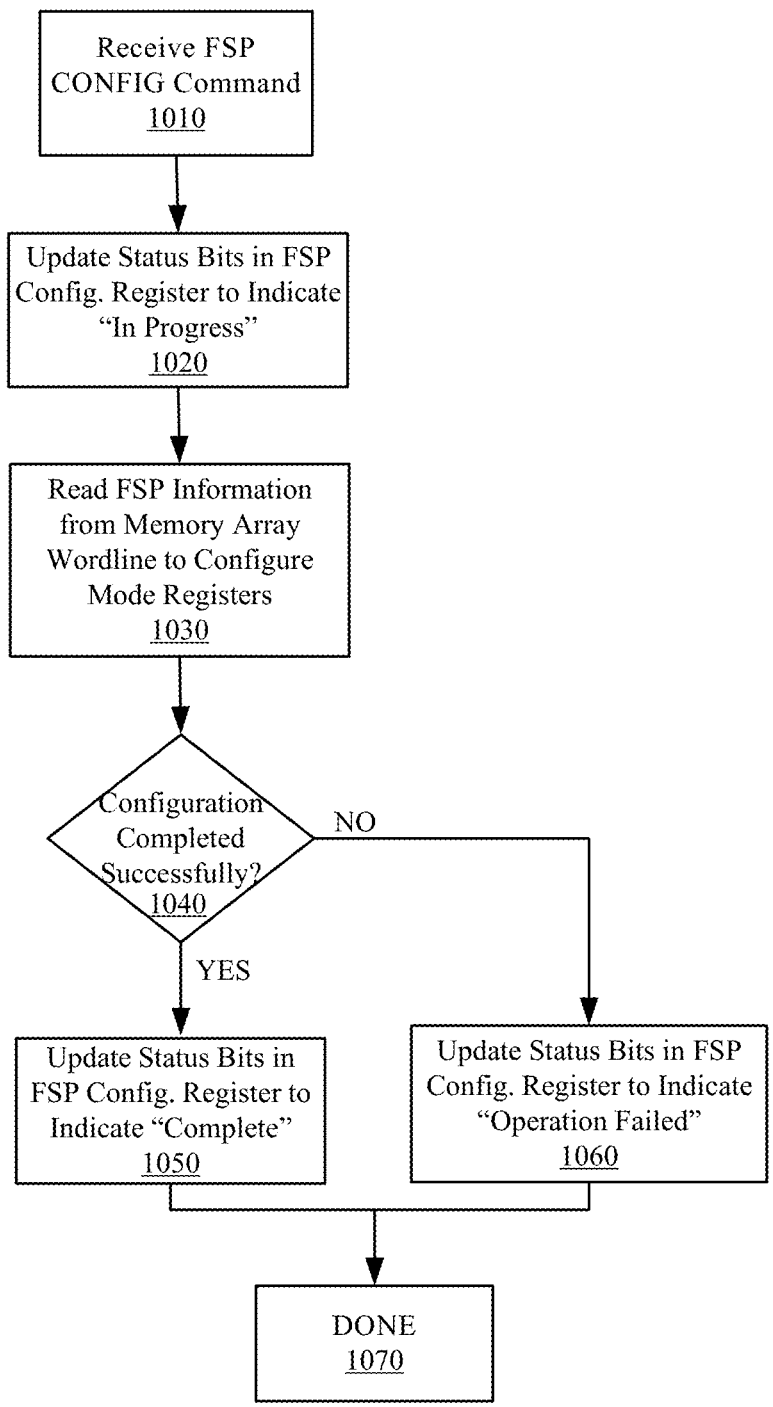
FIG. 10 illustrates an example third logic flow.

FIG. 10 illustrates an example logic flow 1000. In some examples, logic flow 1000 may depict a logic flow for configuring a memory device using FSP information stored to a WL/row of a bank for a memory array of the memory device responsive to an FSP CONFIG command. For these examples, elements of systems 200 and 300 shown in FIG. 2 or 3 and described above may be used to describe processes or actions associated with at least portions of logic flow 600. For example, processor 210 command logic 224 of memory controller 220, memory 230, CMD execution logic 234, mode registers 236 or array 240. Also, example the example register format for FSP configuration register 700 and table 800 for describing example fields of FSP configuration register 700 as shown in FIGS. 7 and 8 may also be associated with at least portions of logic flow 600. Although examples are not limited to elements of systems 200 and 300 or to the to the use of the example fields or bits of FSP configuration register 700 and table 800.

Beginning at block 1010, an FSP CONFIG command may be received from command logic 224. In some examples, the FSP CONFIG command may be sent following an indication by processor 210 that a first FSP is to be used in association with DVFS techniques implemented by processor 210 to save power. For these examples, the FSP CONFIG command may be received by CMD execution logic 234 at memory 230. The FSP CONFIG command may indicate that a mode register in the example format of FSP configuration register 700 is to be programmed to indicate a switch to a mode of operation that corresponds to the first FSP. The FSP CONFIG command may cause CMD execution logic 234 to selectively asserts bits 0 and 1 of OP[1:0] of a mode register in the example format of FSP configuration register 700 to indicate the mode is to correspond to the first FSP.

Moving to block 1020, CMD execution logic 234 may cause an update to the bits of FSP switch status field 720 (OP[3:2]) of the mode register in the example format of FSP configuration register 700 to indicate that the FSP switch is in progress.

Moving to block 1030, CMD execution logic 234 may cause FSP information for the first FSP to be read from a WL/row of a bank of an array included in memory 230 and use the FSP information to configure or program mode registers 236 in order to switch memory 230 to a mode of operation that corresponds to the first FSP. In some examples, the FSP information for the first FSP may have been stored to WL/row 246(Q-1) of bank 244 of array 240 included in memory 230.

Moving to decision block 1040, CMD execution logic 234 may determine whether the configuration or programming of mode registers 236 was completed successfully. In some examples, bit errors in the WL/row of the bank used to store the FSP may be detected. The detected bit errors may lead to an improper or inoperable configuration of mode registers 236. If CMD execution logic 234 determines that the configuration or programming of mode registers 236 was successfully completed, the logic flow moves to block 1050. Otherwise, the logic flow moves to block 1060.

Moving from decision block 1040 to block 1050, CMD execution logic 234 may update bits of the FSP switch status field 720 (OP[3:2]) of the mode register in the example format of FSP configuration register 700 to indicate that the FSP switch is complete. This "Complete" status indication may be later read by CMD execution logic 234 responsive to commands received from command logic 224 to request the status of the FSP switch.

Moving from decision block 1040 to block 1060, CMD execution logic 234 may update bits of the FSP switch status field 720 (OP[3:2]) of the mode register in the example format of FSP configuration register 700 to indicate that the operation failed for the FSP switch. This "Operation Failed" status indication may be later read by CMD execution logic 234 responsive to commands received from command logic 224 to request the status of the FSP switch. In some examples, processor 210 may abort the first FSP and return to a normal mode of operation or attempt to switch to another FSP.

Moving from block 1050 or block 1060 the logic flow is done at block 1070.

Figure 11:
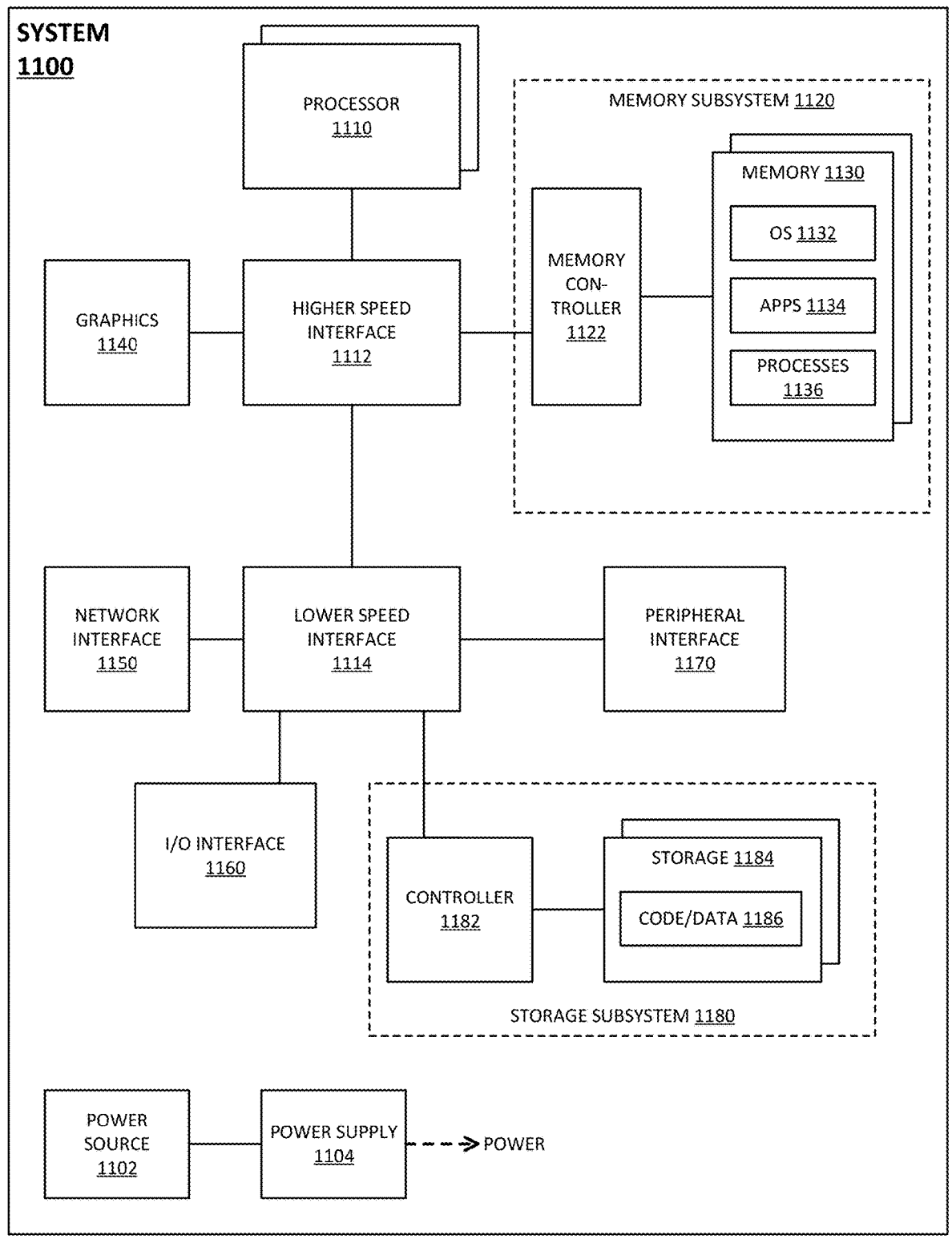
FIG. 11 illustrates an example third system.

FIG. 11 illustrates an example system 1100. System 1100 may represent a computing device in accordance with any example described herein, and can be a laptop computer, a desktop computer, a server, a gaming or entertainment control system, a scanner, copier, printer, routing or switching device, embedded computing device, or other electronic device.

In some examples, as shown in FIG. 11, system 1100 includes processor 1110, which provides processing, operation management, and execution of instructions for system 1100. Processor 1110 may include any type of microprocessor, central processing unit (CPU), graphics processing unit (GPU), processing core, or other processing hardware to provide processing for system 1100, or a combination of processors including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. Processor 1110 may control the overall operation of system 1100, and can be or include, one or more programmable general-purpose or special-purpose microprocessors, digital signal processors (DSPs), programmable controllers, application specific integrated circuits (ASICs), programmable logic devices (PLDs) field programmable gate array (FPGA), or the like, or a combination of such devices.

According to some examples, system 1100 includes interface 1112 coupled to processor 1110, which can represent a higher speed interface or a high throughput interface for system components that needs higher bandwidth connections, such as memory subsystem 1120 or graphics interface components 1140. Interface 1112 may represent a "north bridge" circuit, which may be a standalone component or integrated onto a processor die. Graphics interface 1140 interfaces to graphics components for providing a visual display to a user of system 1100. In some examples, graphics interface 1140 generates a display based on data stored in memory 1130 or based on operations executed by processor 1110 or both.

Memory subsystem 1120 represents the main memory of system 1100, and provides storage for code to be executed by processor 1110, or data values to be used in executing a routine. Memory subsystem 1120 can include one or more memory devices 1130 such as read-only memory (ROM), flash memory, one or more varieties of random access memory (RAM), or other memory devices, or a combination of such devices.

Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide logic to provide functions for system 1100. In some examples, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110.

While not specifically illustrated, it will be understood that system 1100 may include one or more buses or bus systems between devices, such as a memory bus, a graphics bus, interface buses, or others. Buses or other signal lines can communicatively or electrically couple components together, or both communicatively and electrically couple the components. Buses may include physical communication lines, point-to-point connections, bridges, adapters, controllers, or other circuitry or a combination. Buses can include, for example, one or more of a system bus, a Peripheral Component Interconnect (PCI) bus, a PCI Express (PCIe) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In some examples, system 1100 includes interface 1114, which may be coupled to interface 1112. Interface 1114 may be a lower speed interface than interface 1112. In some examples, interface 1114 can be a "south bridge" circuit, which can include standalone components and integrated circuitry. In some examples, multiple user interface components or peripheral components, or both, couple to interface 1114. Network interface 1150 provides system 1100 the ability to communicate with remote devices (e.g., servers or other computing devices) over one or more networks. Network interface 1150 may include an Ethernet adapter, wireless interconnection components, USB (universal serial bus), or other wired or wireless standards-based or proprietary interfaces. Network interface 1150 may exchange data with a remote device, which may include sending data stored in memory or receiving data to be stored in memory.

In some examples, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 may include any hardware interface not specifically mentioned above. Peripherals refer generally to devices that connect dependently to system 1100. A dependent connection is one where system 1100 provides the software platform or hardware platform or both on which operation executes, and with which a user interacts.

In some examples, system 1100 includes storage subsystem 1180 to store data in a nonvolatile manner. In some examples, in certain system implementations, at least certain components of storage 1180 may overlap with components of memory subsystem 1120. Storage subsystem 1180 includes storage device(s) 1184, which con be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 may include volatile memory (i.e., the value or state of the data is indeterminate if power is interrupted to system 1100). In some examples, storage subsystem 1180 includes controller 1182 to interface with storage 1184. In some examples controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In some examples, power supply 1104 includes an AC to DC (alternating current to direct current) adapter to plug into a wall outlet. Such AC power can be renewable energy (e.g., solar power) power source 1102. In some examples, power source 1102 includes a DC power source, such as an external AC to DC converter. In some examples, power source 1102 or power supply 1104 includes wireless charging hardware to charge via proximity to a charging field. In some examples, power source 1102 can include an internal battery or fuel cell source.

In some examples, the memory subsystem 1120 may enable a storing of FSP information to configure mode registers for respective modes of operation associated with one or more FSPs as described in examples above.

Figure 12:
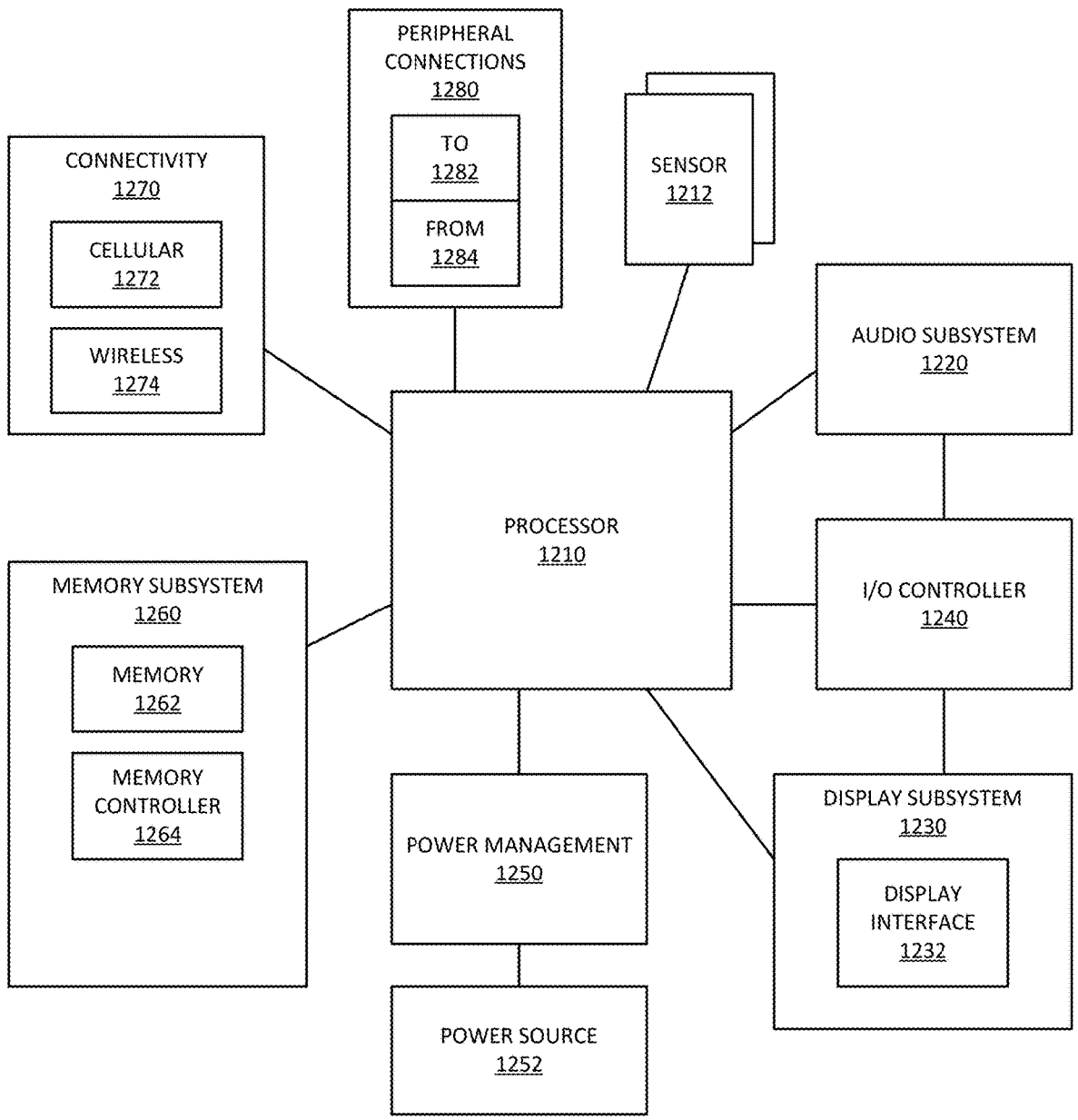
FIG. 12 illustrates an example fourth system.

FIG. 12 illustrates an example system 1200. In some examples, as shown in FIG. 12 system 1200 depicts a block diagram of a mobile device in which a method of storing of FSP information to configure mode registers for respective modes of operation associated with one or more FSPs may be implemented, in accordance with one or more examples. Device 1200 represents a mobile computing device, such as a computing tablet, a mobile phone or smartphone, a wireless-enabled e-reader, wearable computing device, or other mobile device, or an embedded computing device. It will be understood that certain of the components are shown generally, and not all components of such a device are shown in device 1200.

Device 1200 includes processor 1210, which performs the primary processing operations of device 1200. Processor 1210 may include one or more physical devices, such as microprocessors, application processors, microcontrollers, programmable logic devices, or other processing means. The processing operations performed by processor 1210 include the execution of an operating platform or operating system on which applications and device functions are executed. The processing operations include operations related to I/O with a human user or with other devices, operations related to power management, operations related to connecting device 1200 to another device, or a combination. The processing operations may also include operations related to audio I/O, display I/O, or other interfacing, or a combination. Processor 1210 may execute data stored in memory. Processor 1210 can write or edit data stored in memory.

In some examples, system 1200 includes one or more sensors 1212. Sensors 1212 may represent embedded sensors or interfaces to external sensors, or a combination. Sensors 1212 enable system 1200 to monitor or detect one or more conditions of an environment or a device in which system 1200 is implemented. Sensors 1212 may include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, glucose monitors, or other sensors to detect medical or physiological attributes), or other sensors, or a combination. Sensors 1212 may also include sensors for biometric systems such as fingerprint detectors, face detection or recognition systems, or other systems that detect or recognize user features. Sensors 1212 should be understood broadly, and not limiting on the many different types of sensors that could be implemented with system 1200. In some examples, one or more sensors 1212 couples to processor 1210 via a frontend circuit integrated with processor 1210. In some examples, one or more sensors 1212 couples to processor 1210 via another component of system 1200.

In some examples, device 1200 includes audio subsystem 1220, which represents hardware (e.g., audio hardware and audio circuits) and software (e.g., drivers, codecs) components associated with providing audio functions to the computing device. Audio functions may include speaker or headphone output, as well as microphone input. Devices for such functions can be integrated into device 1200, or connected to device 1200. In some examples, a user interacts with device 1200 by providing audio commands that are received and processed by processor 1210.

Display subsystem 1230 represents hardware (e.g., display devices) and software components (e.g., drivers) that provide a visual display for presentation to a user. In some examples, the display includes tactile components or touchscreen elements for a user to interact with the computing device. Display subsystem 1230 includes display interface 1232, which includes the particular screen or hardware device used to provide a display to a user. In some examples, display interface 1232 includes logic separate from processor 1210 (such as a graphics processor) to perform at least some processing related to the display. In some examples, display subsystem 1230 includes a touchscreen device that provides both output and input to a user. In some examples, display subsystem 1230 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In some examples, display subsystem 1230 generates display information based on data stored in memory and operations executed by processor 1210.

I/O controller 1240 represents hardware devices and software components related to interaction with a user. I/O controller 1240 may operate to manage hardware that is part of audio subsystem 1220, or display subsystem 1230, or both. Additionally, I/O controller 1240 illustrates a connection point for additional devices that connect to device 1200 through which a user might interact with the system. For example, devices that may be attached to device 1200 might include microphone devices, speaker or stereo systems, video systems or other display device, keyboard or keypad devices, or other I/O devices for use with specific applications such as card readers or other devices.

As mentioned above, I/O controller 1240 may interact with audio subsystem 1220 or display subsystem 1230 or both. For example, input through a microphone or other audio device can provide input or commands for one or more applications or functions of device 1200. Additionally, audio output may be provided instead of or in addition to display output. In another example, if display subsystem includes a touchscreen, the display device also acts as an input device, which can be at least partially managed by I/O controller 1240. There can also be additional buttons or switches on device 1200 to provide I/O functions managed by I/O controller 1240.

In some examples, I/O controller 1240 manages devices such as sensors 1212, accelerometers, cameras, light sensors or other environmental sensors, gyroscopes, global positioning system (GPS), or other hardware that can be included in device 1200. The input can be part of direct user interaction, as well as providing environmental input to the system to influence its operations (such as filtering for noise, adjusting displays for brightness detection, applying a flash for a camera, or other features).

In some examples, device 1200 includes power management 1250 that manages battery power usage, charging of the battery, and features related to power saving operation. Power management 1250 manages power from power source 1252, which provides power to the components of system 1200. In some examples, power source 1252 includes an AC to DC (alternating current to direct current) adapter to plug into a wall outlet. Such AC power can be renewable energy (e.g., solar power, motion based power). In some examples, power source 1252 includes only DC power, which may be provided by a DC power source, such as an external AC to DC converter. In some examples, power source 1252 includes wireless charging hardware to charge via proximity to a charging field. In some examples, power source 1252 may include an internal battery or fuel cell source.

Memory subsystem 1260 includes memory device(s) 1262 for storing information in device 1200. Memory subsystem 1260 may include no-volatile types of memory or volatile types of memory or a combination. Memory 1260 may store application data, user data, music, photos, documents, or other data, as well as system data (whether long-term or temporary) related to the execution of the applications and functions of system 1200. In some examples, memory subsystem 1260 includes memory controller 1264 (which could also be considered part of the control of system 1200, and could potentially be considered part of processor 1210). Memory controller 1264 includes a scheduler to generate and issue commands to memory device 1262. The device 1200 also include a storage subsystem 1206. The storage subsystem 1206 includes one or more storage devices 1201 and a controller 1205 for controlling access to the storage devices 1201.

Connectivity 1270 includes hardware devices (e.g., wireless or wired connectors and communication hardware, or a combination of wired and wireless hardware) and software components (e.g., drivers, protocol stacks) to enable device 1200 to communicate with external devices. The external device could be separate devices, such as other computing devices, wireless access points or base stations, as well as peripherals such as headsets, printers, or other devices. In some examples, system 1200 exchanges data with an external device for storage in memory or for display on a display device. The exchanged data can include data to be stored in memory, or data already stored in memory, to read, write, or edit data.

Connectivity 1270 can include multiple different types of connectivity. To generalize, device 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1274 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1280 include hardware interfaces and connectors, as well as software components (e.g., drivers, protocol stacks) to make peripheral connections. It will be understood that device 1200 could both be a peripheral device ("to" 1282) to other computing devices, as well as have peripheral devices ("from" 1284) connected to it. Device 1200 commonly has a "docking" connector to connect to other computing devices for purposes such as managing (e.g., downloading, uploading, changing, synchronizing) content on device 1200. Additionally, a docking connector can allow device 1200 to connect to certain peripherals that allow device 1200 to control content output, for example, to audiovisual or other systems.

In addition to a proprietary docking connector or other proprietary connection hardware, device 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In some examples, the memory subsystem 1260 may enable a storing of FSP information to configure mode registers for respective modes of operation associated with one or more FSPs as described in examples above.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

EXAMPLE 1

An example memory device may include mode registers, a memory array and circuitry to implement logic. For the example memory device, the logic may program the mode registers responsive to receipt of one or more commands to configure the memory array for a first mode of operation that corresponds to a first FSP associated with DVFS for a processor coupled with the memory device. The logic may also copy information from the programmed mode registers to generate first FSP information. The logic may also store the first FSP information to the memory array.

EXAMPLE 2

The memory device of example 1, the logic may also update one or more bits of a first mode register from among the mode registers of the memory device to indicate a status of the storing of the first FSP information to the memory array.

EXAMPLE 3

The memory device of example 2, the status may include one of complete, in progress or operation failed.

EXAMPLE 4

The memory device of example 1, the logic may copy the information from the programmed mode registers responsive to receipt of a command to store FSP information to the memory array.

EXAMPLE 5

The memory device of example 1, the logic may also reprogram at least a portion of the mode registers responsive to receipt of one or more commands to configure the memory array for a second mode of operation that corresponds to a second FSP associated with DVFS for the processor. The logic may also copy information from the mode registers to generate second FSP information. The logic may also store the second FSP information to the memory array.

EXAMPLE 6

The memory device of example 1, the logic may also determine whether the second FSP information is for a last mode of operation that corresponds to a last FSP associated with DVFS for the processor. The logic may also cause the memory array to enter a third mode of operation that corresponds to a normal mode of operation based on the second FSP information determined as being for the last mode of operation.

EXAMPLE 7

The memory device of example 6, the logic to determine whether the second FSP information is for the last mode of operation may be based on an indication in the command to store FSP information that indicates how many FSPs are associated with DVFS for the processor.

EXAMPLE 8

The memory device of example 1, the logic to store the first FSP information to the memory array may include the logic to store the first FSP information to a memory address for a row of a bank included in the memory array.

EXAMPLE 9

The memory device of example 8, the row of the bank included in the memory array may include a spare row used only internally by the logic of the memory device and not available for storing to logic external to the memory device.

EXAMPLE 10

The memory device of example 8, the logic may also receive an FSP configuration command that causes a second mode register from among the mode registers to be programmed to indicate a switch to the first mode of operation. The logic may also read the first FSP information from the memory address for the row of the bank included in the memory array. The logic may also reprogram at least a portion of the mode registers using the first FSP information.

EXAMPLE 11

The memory device of example 10, the logic may also update one or more bits of the second mode register to indicate a status of the switch to the first mode of operation.

EXAMPLE 12

The memory device of example 11, the status may include one of complete, in progress or operation failed.

EXAMPLE 13

The memory device of example 1, the memory array may include non-volatile memory or volatile memory, wherein the volatile memory includes dynamic random access memory (DRAM) and the non-volatile memory includes 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

EXAMPLE 14

An example method may include programming, at circuitry for a memory device, mode registers of the memory device responsive to receiving one or more commands to configure a memory array included in the memory device. The memory array may be configured for a first mode of operation that corresponds to a first FSP associated with DVFS for a processor coupled with the memory device. The method may also include copying information from the programmed mode registers to generate first FSP information. The method may also include storing the first FSP information to the memory array.

EXAMPLE 15

The method of example 14, may also include updating one or more bits of a first mode register from among the mode registers of the memory device to indicate a status of the storing of the first FSP information to the memory array.

EXAMPLE 16

The method of example 15, the status may include one of complete, in progress or operation failed.

EXAMPLE 17

The method of example 14, copying the information responsive to receiving a command to store FSP information to the memory array.

EXAMPLE 18

The method of example 17, may also include reprogramming at least a portion of the mode registers of the memory device responsive to receiving one or more commands to configure the memory array for a second mode of operation that corresponds to a second FSP associated with DVFS for the processor. The method may also include copying information from the mode registers to generate second FSP information. The method may also include storing the second FSP information to the memory array.

EXAMPLE 19

The method of example 18, may also include determining whether the second FSP information is for a last mode of operation that corresponds to a last FSP associated with DVFS for the processor. The method may also include causing the memory array to enter a third mode of operation that corresponds to a normal mode of operation based on the second FSP information determined as being for the last mode of operation.

EXAMPLE 20

The method of example 19, determining whether the second FSP information is for the last mode of operation may be based on an indication in the command to store FSP information that indicates how many FSPs are associated with DVFS for the processor.

EXAMPLE 21

The method of example 14, storing the first FSP information to the memory array may include storing the first FSP information to a memory address for a row of a bank included in the memory array.

EXAMPLE 22

The method of example 21, the row of the bank included in the memory array may be a spare row used only internally by circuitry of the memory device and not available for storing to logic external to the memory device.

EXAMPLE 23

The method of example 21, may also include receiving an FSP configuration command that causes a second mode register from among the mode registers to be programmed to indicate a switch to the first mode of operation. The method may also include reading the first FSP information from the memory address for the row of the bank included in the memory array. The method may also include reprogramming at least a portion of the mode registers for the memory device using the first FSP information.

EXAMPLE 24

The method of example 23 may also include updating one or more bits of the second mode register to indicate a status of the switch to the first mode of operation.

EXAMPLE 25

The method of example 24, the status may be one of complete, in progress or operation failed.

EXAMPLE 26

The method of example 14, the memory array may include non-volatile memory or volatile memory, wherein the volatile memory includes dynamic random access memory (DRAM) and the non-volatile memory includes 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

EXAMPLE 27

An example at least one machine readable medium may include a plurality of instructions that in response to being executed by a system may cause the system to carry out a method according to any one of examples 14 to 26.

EXAMPLE 28

An example apparatus may include means for performing the methods of any one of examples 14 to 26.

EXAMPLE 29

An example apparatus may include an input/output interface to couple with a memory device. The apparatus may also include a memory controller for a processor. The memory controller may include logic, at least a portion of which is implemented in hardware, the logic may receive an indication that a first FSP associated with DVSF is to be implemented by the processor. The logic may also send a command to the memory device to cause the memory device to program a first mode register to indicate a switch to a first mode of operation for a memory array included in the memory device, the first mode to corresponds to the first FSP. The indication of the switch may cause the memory device to retrieve first FSP information stored in the memory array and program at least a portion of mode registers of the memory device to cause the memory array to switch to the first mode of operation.

EXAMPLE 30

The apparatus of example 29 may also include the logic to send a second command to the memory device to read one or more bits of the first mode register to determine a status of the switch to the first mode of operation by the memory array. The logic may also indicate to the processor the status of the switch to the first mode.

EXAMPLE 31

The apparatus of example 30, the status may include one of complete, in progress or operation failed.

EXAMPLE 32

An example method may include receiving, at a memory controller for a processor, an indication that a first FSP associated with DVSF is to be implemented by the processor. The method may also include sending a command to a memory device to cause the memory device to program a first mode register to indicate a switch to a first mode of operation for a memory array including in the memory device. The first mode may corresponds to the first FSP, the indication of the switch to cause the memory device to retrieve first FSP information stored in the memory array and program at least a portion of mode registers of the memory device to cause the memory array to switch to the first mode of operation.

EXAMPLE 33

The method of example 32 may also include sending a second command to the memory device to read one or more bits of the first mode register to determine a status of the switch to the first mode of operation by the memory array. The method may also include indicating to the processor the status of the switch to the first mode.

EXAMPLE 34

The method of example 33, the status may include one of complete, in progress or operation failed.

EXAMPLE 35

An example at least one machine readable medium may include a plurality of instructions that in response to being executed by a system may cause the system to carry out a method according to any one of examples 32 to 35.

EXAMPLE 36

An example apparatus may include means for performing the methods of any one of examples 32 to 35.

EXAMPLE 37

An example system may include a processor, a memory controller and
a memory device. The memory device may include circuitry to implement logic. For these examples, the logic may receive one or more commands from the memory controller to configure a memory array included in the memory device. The memory array may be configured for a first mode of operation that corresponds to a first FSP associated with DVFS for the processor. The logic may also program mode registers of the memory device to configure the memory array. The logic may also copy information from the programmed mode registers to generate first FSP information. The logic may also store the first FSP information to the memory array.

EXAMPLE 38

The system of example 37, the logic may also update one or more bits of a first mode register from among the mode registers of the memory device to indicate a status of the storing of the first FSP information to the memory array.

EXAMPLE 39

The system of example 38, the status may include one of complete, in progress or operation failed.

EXAMPLE 40

The system of example 37, the logic may copy the information from the programmed mode registers responsive to receipt of a command from the memory controller to store FSP information to the memory array.

EXAMPLE 41

The system of example 40, the logic may also receive one or more commands to configure the memory array for a second mode of operation that corresponds to a second FSP associated with DVFS for the processor. The logic may also reprogram at least a portion of the mode registers of the memory device to configure the memory array for the second mode of operation. The logic may also copy information from the mode registers to generate second FSP information. The logic may also store the second FSP information to the memory array.

EXAMPLE 42

The system of example 41, the logic may also determine whether the second FSP information is for a last mode of operation that corresponds to a last FSP associated with DVFS for the processor. The logic may also cause the memory array to enter a third mode of operation that corresponds to a normal mode of operation based on the second FSP information determined as being for the last mode of operation.

EXAMPLE 43

The system of example 42, the logic may determine whether the second FSP information is for the last mode of operation is based on an indication in the command to store FSP information that indicates how many FSPs are associated with DVFS for the processor.

EXAMPLE 44

The system of example 37, the logic to store the first FSP information to the memory array may include the logic to store the first FSP information to a memory address for a row of a bank included in the memory array.

EXAMPLE 45

The system of example 44, the row of the bank included in the memory array may be a spare row used only internally by the logic of the memory device and the memory address for the spare row is not available to the memory controller.

EXAMPLE 46

The system of example 44, the logic may also receive an FSP configuration command that causes a second mode registers from among the mode registers to be programmed to indicate a switch to the first mode of operation. The logic may also read the first FSP information from the memory address for the row of the bank included in the memory array. The logic may also reprogram at least a portion of the mode registers using the first FSP information.

EXAMPLE 47

The system of example 46, the logic may also update one or more bits of the second mode register to indicate a status of the switch to the first mode of operation.

EXAMPLE 48

The system of example 47, the status may be one of complete, in progress or operation failed.

EXAMPLE 49

The system of example 37, the memory array may include non-volatile memory or volatile memory. The volatile memory may include dynamic random access memory (DRAM) and the non-volatile memory may include 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory device comprising:
    mode registers;
    a memory array; and
    circuitry to implement logic, the logic to:
        program the mode registers responsive to receipt of one or more commands to configure the memory array for a first mode of operation that corresponds to a first frequency set point (FSP) associated with dynamic voltage and frequency scaling (DVFS) for a processor coupled with the memory device;
        copy information from the programmed mode registers to generate first FSP information; and
        store the first FSP information to the memory array.

2. The memory device of claim 1, further comprising the logic to:
    update one or more bits of a first mode register from among the mode registers of the memory device to indicate a status of the storing of the first FSP information to the memory array.

3. The memory device of claim 2, the status comprising one of complete, in progress or operation failed.

4. The memory device of claim 1, the logic to copy the information from the programmed mode registers responsive to receipt of a command to store FSP information to the memory array.

5. The memory device of claim 1, further comprising the logic to:
    reprogram at least a portion of the mode registers responsive to receipt of one or more commands to configure the memory array for a second mode of operation that corresponds to a second FSP associated with DVFS for the processor; and
    copy information from the mode registers to generate second FSP information; and
    store the second FSP information to the memory array.

6. The memory device of claim 1, further comprising the logic to:
    determine whether the second FSP information is for a last mode of operation that corresponds to a last FSP associated with DVFS for the processor; and
    cause the memory array to enter a third mode of operation that corresponds to a normal mode of operation based on the second FSP information determined as being for the last mode of operation.

7. The memory device of claim 6, comprising the logic to determine whether the second FSP information is for the last mode of operation is based on an indication in the command to store FSP information that indicates how many FSPs are associated with DVFS for the processor.

8. The memory device of claim 1, the logic to store the first FSP information to the memory array comprises the logic to store the first FSP information to a memory address for a row of a bank included in the memory array.

9. The memory device of claim 8, the row of the bank included in the memory array comprising a spare row used only internally by the logic of the memory device and not available for storing to logic external to the memory device.

10. The memory device of claim 8, further comprising the logic to:
    receive an FSP configuration command that causes a second mode register from among the mode registers to be programmed to indicate a switch to the first mode of operation;
    read the first FSP information from the memory address for the row of the bank included in the memory array; and
    reprogram at least a portion of the mode registers using the first FSP information.

11. The memory device of claim 10, further comprising the logic to:
    update one or more bits of the second mode register to indicate a status of the switch to the first mode of operation.

12. The memory device of claim 11, the status comprising one of complete, in progress or operation failed.

13. The memory device of claim 1, comprising the memory array to include non-volatile memory or volatile memory, wherein the volatile memory includes dynamic random access memory (DRAM) and the non-volatile memory includes 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

14. A method comprising:
programming, at circuitry for a memory device, mode registers of the memory device responsive to receiving one or more commands to configure a memory array included in the memory device, the memory array configured for a first mode of operation that corresponds to a first frequency set point (FSP) associated with dynamic voltage and frequency scaling (DVFS) for a processor coupled with the memory device;
copying information from the programmed mode registers to generate first FSP information; and
storing the first FSP information to the memory array.

15. The method of claim 14, copying the information responsive to receiving a command to store FSP information to the memory array.

16. The method of claim 15, further comprising:
reprogramming at least a portion of the mode registers of the memory device responsive to receiving one or more commands to configure the memory array for a second mode of operation that corresponds to a second FSP associated with DVFS for the processor; and
copying information from the mode registers to generate second FSP information; and
storing the second FSP information to the memory array.

17. The method of claim 16, further comprising:
determining whether the second FSP information is for a last mode of operation that corresponds to a last FSP associated with DVFS for the processor; and
causing the memory array to enter a third mode of operation that corresponds to a normal mode of operation based on the second FSP information determined as being for the last mode of operation.

18. The method of claim 17, comprising determining whether the second FSP information is for the last mode of operation is based on an indication in the command to store FSP information that indicates how many FSPs are associated with DVFS for the processor.

19. The method of claim 14, storing the first FSP information to the memory array comprises storing the first FSP information to a memory address for a row of a bank included in the memory array.

20. The method of claim 19, further comprising:
receiving an FSP configuration command that causes a mode register from among the mode registers to be programmed to indicate a switch to the first mode of operation;
reading the first FSP information from the memory address for the row of the bank included in the memory array; and
reprogramming at least a portion of the mode registers for the memory device using the first FSP information.

21. An apparatus comprising:
an input/output interface to couple with a memory device; and
a memory controller for a processor, the memory controller including logic, at least a portion of which is implemented in hardware, the logic to:
receive an indication that a first frequency set point (FSP) associated with dynamic voltage and frequency scaling (DVSF) is to be implemented by the processor; and
send a command to the memory device to cause the memory device to program a first mode register to indicate a switch to a first mode of operation for a memory array included in the memory device, the first mode to corresponds to the first FSP, the indication of the switch to cause the memory device to retrieve first FSP information stored in the memory array and program at least a portion of mode registers of the memory device to cause the memory array to switch to the first mode of operation.

22. The apparatus of claim 21, further comprising the logic to:
send a second command to the memory device to read one or more bits of the first mode register to determine a status of the switch to the first mode of operation by the memory array; and
indicate to the processor the status of the switch to the first mode.

23. The apparatus of claim 22, the status comprising one of complete, in progress or operation failed.

24. A system comprising:
a processor;
a memory controller; and
a memory device that includes circuitry to implement logic, the logic to:
receive one or more commands from the memory controller to configure a memory array included in the memory device, the memory array configured for a first mode of operation that corresponds to a first frequency set point (FSP) associated with dynamic voltage and frequency scaling (DVFS) for the processor;
program mode registers of the memory device to configure the memory array;
copy information from the programmed mode registers to generate first FSP information; and
store the first FSP information to the memory array.

25. The system of claim 24, the logic to copy the information from the programmed mode registers responsive to receipt of a command from the memory controller to store FSP information to the memory array.

26. The system of claim 25, further comprising the logic to:
receive one or more commands to configure the memory array for a second mode of operation that corresponds to a second FSP associated with DVFS for the processor;
reprogram at least a portion of the mode registers of the memory device to configure the memory array for the second mode of operation; and
copy information from the mode registers to generate second FSP information; and
store the second FSP information to the memory array.

27. The system of claim 26, further comprising the logic to:
determine whether the second FSP information is for a last mode of operation that corresponds to a last FSP associated with DVFS for the processor; and cause the memory array to enter a third mode of operation that corresponds to a normal mode of operation based on the second FSP information determined as being for the last mode of operation.

28. The system of claim 24, the logic to store the first FSP information to the memory array comprises the logic to store the first FSP information to a memory address for a row of a bank included in the memory array.

29. The system of claim 28, further comprising the logic to:

receive an FSP configuration command that causes a mode register from among the mode registers to be programmed to indicate a switch to the first mode of operation;

read the first FSP information from the memory address for the row of the bank included in the memory array; and reprogram at least a portion of the mode registers using the first FSP information.

30. The system of claim 29, further comprising the logic to:

update one or more bits of the second mode register to indicate a status of the switch to the first mode of operation, the status including one of complete, in progress or operation failed.

* * * * *